(12) United States Patent
Hoeschen et al.

(10) Patent No.: US 9,513,377 B2
(45) Date of Patent: Dec. 6, 2016

(54) METHOD FOR MEASURING RADIATION BY MEANS OF AN ELECTRONIC TERMINAL HAVING A DIGITAL CAMERA

(75) Inventors: Christoph Hoeschen, Hebertshausen (DE); Rolf-Dieter Klein, Munich (DE); Mathias Reichl, Kelheim (DE)

(73) Assignees: Helmholtz Zentrum Muenchen Deutsches Forschungszentrum fuer Gesundheit und Umwelt (GmbH), Neuherberg (DE); Rolf-Dieter Klein, Munich (DE); Mathias Reichl, Kelheim (DE)

( * ) Notice: Subject to any disclaimer, the term of this patent is extended or adjusted under 35 U.S.C. 154(b) by 235 days.

(21) Appl. No.: 14/353,084

(22) PCT Filed: Oct. 24, 2011

(86) PCT No.: PCT/EP2011/005353
§ 371 (c)(1),
(2), (4) Date: Nov. 10, 2014

(87) PCT Pub. No.: WO2013/060342
PCT Pub. Date: May 2, 2013

(65) Prior Publication Data
US 2015/0072729 A1    Mar. 12, 2015

(51) Int. Cl.
*H04M 1/00*    (2006.01)
*G01T 1/00*    (2006.01)
(Continued)

(52) U.S. Cl.
CPC .................. *G01T 1/00* (2013.01); *G01C 11/00* (2013.01); *G01T 1/026* (2013.01); *G01T 1/18* (2013.01);
(Continued)

(58) Field of Classification Search
None
See application file for complete search history.

(56) References Cited

U.S. PATENT DOCUMENTS 4,381,450 A    4/1983 Cappelli
5,561,297 A * 10/1996 Engdahl ................ G01T 1/1642
250/363.07
(Continued)

FOREIGN PATENT DOCUMENTS

DE    102009008025 A1    8/2010
DE    102009056055 A1    5/2011
(Continued)

OTHER PUBLICATIONS

Barzilov et al., "Network of wireless gamma ray sensors for radiological detection and identification", Proc. of SPIE, vol. 6540, pp. 654012-1-654012-8 (2007).
(Continued)

*Primary Examiner* — Dominic Rego
(74) *Attorney, Agent, or Firm* — Caesar Rivise, PC

(57) ABSTRACT

The invention relates to a method for operating an electronic terminal (1.1-1.4) comprising an integrated image sensor (2.1-2.4) that has a large number of pixels, in particular for a mobile telephone. According to the invention, a dosage value of ionizing radiation striking the image sensor is determined by means of the image sensor (2.1-2.4). The invention further relates to a terminal that operates accordingly (e.g. a smart phone having a corresponding application program).

20 Claims, 5 Drawing Sheets

(51) Int. Cl.
*G01T 1/02* (2006.01)
*G01T 1/29* (2006.01)
*G01T 7/00* (2006.01)
*G01T 1/18* (2006.01)
*G01T 1/24* (2006.01)
*H01L 27/146* (2006.01)
*G01C 11/00* (2006.01)
*H04W 4/00* (2009.01)

(52) U.S. Cl.
CPC ............... *G01T 1/24* (2013.01); *G01T 1/2928* (2013.01); *G01T 7/00* (2013.01); *H01L 27/14601* (2013.01); *H04W 4/005* (2013.01)

(56) References Cited

U.S. PATENT DOCUMENTS

| | | | |
|---|---|---|---|
| 7,265,781 B2* | 9/2007 | Noguchi | H04N 9/735 348/188 |
| 7,391,028 B1 | 6/2008 | Rubenstein | |
| 2003/0151774 A1* | 8/2003 | Washio | H04N 1/4057 358/3.13 |
| 2004/0119848 A1* | 6/2004 | Buehler | G06K 9/00771 348/239 |
| 2004/0149918 A1 | 8/2004 | Craig et al. | |
| 2007/0008313 A1* | 1/2007 | Song et al. | H04N 13/0051 345/419 |
| 2008/0009460 A1* | 1/2008 | Linden et al. | A61K 31/7076 514/46 |
| 2008/0056619 A1* | 3/2008 | Ujisato et al. | G06K 9/3241 382/305 |
| 2008/0239114 A1* | 10/2008 | Shin et al. | H04N 5/3675 348/246 |
| 2009/0012745 A1 | 1/2009 | Longman et al. | |
| 2012/0091205 A1* | 4/2012 | Khorsheed et al. | G06K 7/14 235/462.11 |
| 2012/0147140 A1* | 6/2012 | Itakura et al. | H04L 1/0041 348/43 |

FOREIGN PATENT DOCUMENTS

| | | |
|---|---|---|
| EP | 0757474 A1 | 2/1997 |
| GB | 968189 | 8/1964 |
| JP | 2004201784 A | 7/2004 |
| JP | 2007104555 A | 4/2007 |
| JP | 2007215868 A | 8/2007 |
| JP | 2004201784 A | 9/2008 |
| JP | 2007104555 A | 11/2010 |
| WO | 2004079395 A2 | 9/2004 |
| WO | 2008110182 A1 | 9/2008 |
| WO | 2010083006 A2 | 7/2010 |
| WO | 2013060347 A1 | 5/2013 |
| WO | 2013060348 A1 | 5/2013 |

OTHER PUBLICATIONS

Dafinf GmbH, "BQSan zur Messung radioaktiver Strahlung mit Digitalkameras" (& English version: "BQScan—Measure Radioactivity using Digital Cameras"), May 2011 (May 2011).

Mukhopadhyay, "Field Deployable Gamma Radiation Detectors for DHS Use", Proc. of SPIE, vol. 6406, pp. 670612-1-670612-8 (2007).

Rubenstein et al., "Detection of Radioactivity in Transit Stations—Phase 2", Oct. 1, 2009 (Oct. 1, 2009), pp. 1-19, XP55031669.

Abstract of DE 10 2009 056055 (2009).

Abstract of DE 10 2009 008025 (2010).

International Search Report for PCT/EP2011/005353 dated Jul. 25, 2012.

English abstract for JP 2004201784 A (2004).

English abstract for JP 2007104555 A (2007).

English abstract for JP 2007215868 A (2007).

English abstract for WO 2007075181 A2 (2007) which corresponds to JP 2008537774 A (2008).

English abstract for EP 2028509 A1 (2009) which corresponds to JP 2010536021 A (2010).

* cited by examiner

METHOD FOR MEASURING RADIATION BY MEANS OF AN ELECTRONIC TERMINAL HAVING A DIGITAL CAMERA

BACKGROUND OF THE INVENTION

The invention concerns an operating method for an electronic terminal unit with an integrated digital camera with an image sensor with a plurality of image elements, in particular for a mobile phone.

Dosimeters are known in the art for measurement of the radiation dose of radioactive radiation, which dosimeters may, for example, be formed as rod dosimeters, ionization chambers, film dosimeters, thermoluminescence dosimeters or as digital electronic dosimeters. The application of the known electronic dosimeters is, however, particularly problematic when a high dose rate (e.g. more than 100 G/h) is to be measured, such as for pulsed radiation for a computer tomograph (CT).

DESCRIPTION OF THE INVENTION

The object of the invention is therefore to provide an alternative option for radiation measurement.

This object is achieved by means of an operating method according to the invention for an electronic terminal unit as well as through a terminal unit working accordingly.

The invention is based upon of the technical-physical insight that the digital cameras incorporated nowadays in many electronic terminal units (e.g. mobile phones, notebooks, netbooks, laptops, etc.) are sensitive not only to electromagnetic radiation in the visible wavelength range, but rather also to ionizing radiation (e.g. radioactive radiation), so that these terminal units can also be used for radiation measurement.

The individual image elements (pixels) of the image sensor of the digital camera provide here each an electric output signal in accordance with the incident radiation. Within the framework of the operating method according to the invention, the output signals of the individual image elements are each compared with a lower limit value and an upper limit value, wherein a counting event is triggered when the output signal lies between the lower limit value and the upper limit value. Both limit values are in this case set forth in such a way that the digital camera is suited for measurement of the respective radiation (e.g. radioactive radiation).

Furthermore, the operating method according to the invention preferably provides for a statistical evaluation of the output signal of the individual image elements of the image sensor of the digital camera in order to measure, with a loss of the initial present spatial resolution of the image sensor, a dosage value as exact as possible of the incident ionizing radiation.

In a preferred exemplary embodiment of the invention, the image sensor measures an image matrix with a plurality of image elements, wherein each image element of the image sensor is assigned to an image element of the image matrix. The image matrix therefore digitally reflects the image measured by the image sensor. The invention then provides that the image matrix is statistically evaluated and a dosage value is determined within the context of statistical evaluation of the ionizing radiation impinging on the image sensor.

Moreover, a counting matrix is preferably derived from the image matrix, wherein the counting matrix for the individual image elements of the image matrix respectively contains an associated counter. The individual counters are then respectively incremented when the associated image element of the image matrix lies between a lower limit value and an upper limit value. Within the context of the invention, the counting matrix can be calculated directly from the image matrix. In the preferred exemplary embodiment of the invention, there is, however, at first a further processing of the image matrix before the counting matrix is calculated.

Moreover, the invention provides that the individual counters of the counting matrix are added to have a sum, which reflects an energy dose of the ionizing radiation. Furthermore, a dose rate can also be calculated within the context of statistical evaluation as the quotient of the energy dose and the respective duration of measurement.

When operating a digital camera with an image sensor with a plurality of image sensors, individual image elements can fail due to faults or change their response, which would lead to a corresponding falsification of the radiation measurement. In the preferred exemplary embodiment of the invention, it is therefore provided for that an error matrix is determined, which contains a correction element for each image element of the image matrix. The measured image matrix is then linked with the error matrix in order that errors of the individual image element can be compensated for. For example, individual defective image elements of the image sensor can be hidden by linking the image matrix with the error matrix. The error matrix can, however, also contain for each image element a correction characteristic in order to compensate for, for example, any modification of characteristic due to aging. The error matrix can, for example, be determined within the context of the calibration process when the image sensor is exposed to a predefined radiation.

Furthermore, within the context of the invention, it is preferably provided for that the image matrix currently measured by the image sensor are each stored temporarily, wherein the currently measured image matrix is compared with a previously measured and temporarily stored image matrix in order to detect interim changes. In this manner, a difference matrix is thus preferably calculated as the difference of a currently measured image matrix with a previously measured and temporarily stored image matrix. The above-mentioned statistical evaluation is then performed preferably based on the difference matrix.

The above-described method according to the invention allows at first only a measurement of a radiation dose or a dose rate. However, within the context of the invention, there is fundamentally also the option of detecting the spectral distribution of the incident ionizing radiation at least approximately. In this case, one exploits the fact that incident photons on the image sensor lead to crosstalk between neighboring image elements depending on the photon energy. Thus, a relatively weak photon generally leads only to a counting event in a single image element of the image sensor. High-energy photons, in contrast, lead to counting events in a whole group of neighboring image elements of the image sensor, wherein the spatial extension of the group of counting events reflects the photon energy. The invention therefore preferably provides for that groups (clusters) of neighboring counting events are determined in the counting matrix. Furthermore, the spatial extension of the individual groups of neighboring counting events is then determined in order to derive therefrom the corresponding photon energy. Through a corresponding image evaluation, it is therefore possible within the context of the method according to the invention to also determine a spectral distribution of the incident radiation.

The radiation measurement according to the invention by means of an electronic terminal unit (e.g. mobile phone) also offers the option that the measured dosage value or a control signal derived therefrom is transmitted by means of a transmitter located in the terminal unit to an external monitoring device. For the radiation measurement with a mobile phone, this communication can, for example, take place by means of a corresponding mobile phone connection. However, within the context of the invention, there is also the option that the communication is carried out by means of a Bluetooth module, by means of a RFID transponder (RFID: Radio-Frequency Identification) or by means of a WLAN module (WLAN: Wireless Local Area Network).

In this context, it should also be mentioned that there is not only the option of transmitting the measured dosage value from the terminal unit to the external monitoring device. For example, a control signal (e.g. an emergency switch-off-signal) can also be transmitted from the terminal unit to an external monitoring device, wherein the control signal is generally derived from the measured dosage value. For example, the monitoring device can be connected with a radiation source (e.g. computer tomograph) and disconnect the radiation source when the dosage values received from the terminal units (e.g. mobile phones) fall below a limit value.

Beyond this, modern electronic terminal units (e.g. mobile phones) often offer the option of determining the geographical position by means of an incorporated satellite navigation receiver such as a GPS module (GPS: Global Positioning System). In the preferred exemplary embodiment of the invention, it is therefore also provided for that the geographical position of the respective terminal unit is also transmitted together with the measured dosage value to the external monitoring device. The external monitoring device can in this manner evaluate dosage values and positions of a plurality of spatially distributed terminal units and create in this manner a geographical map of the dosage value.

Within the context of the operating method according to the invention, a calibration is preferably also provided for in such a way that the terminal unit is exposed to a radiator serving as normal.

The terminal unit used within the context of the invention can be, for example, a mobile phone with an integrated digital camera, wherein so-called smartphones are particular suitable, since the radiation measurement can run in the framework of an application program ("App") on the smartphone. The invention is, however, not limited to mobile phones with respect to of the terminal unit used, but can also, for example, be realized with digital cameras or with transportable computers, such as notebooks, laptops or netbooks. Within the context of the invention, it is merely required that the terminal unit has an integrated digital camera with an image sensor with a plurality of image elements.

The image sensor can, for example, be a CCD sensor (CCD: Charge Coupled Device) or a CMOS sensor (CMOS: Complementary Metal Oxide Semiconductor); however, the invention is basically also realizable with other types of image sensors.

Also the term "dosage value" used within the context of the invention is to be understood generally and comprises, for example, the energy dose, the equivalent dose or also the dose rate of the incident ionizing radiation.

Furthermore, it should be noted that the invention is particularly well suited for measurement of pulsed radiation. Here, it must be observed that the individual image elements of the image sensor are each read-out periodically, wherein a dead time lies between the directly sequential read operations, respectively, within which the respective image element is insensitive and detects no radiation. For the measurement of pulsed, periodic radiation, there is therefore the risk that the individual radiation pulses each fall in the dead time and are therefore not detected. The invention therefore preferably provides for that the individual image elements of the image sensor are read-out in a time-shifted manner, so that the dead times of the individual image elements are also time-shifted. This prevents that the radiation pulses fall in the dead time for all image elements of the image sensor.

It should also be mentioned that the invention allows measurement of the dose rate in a large measuring range of 1 µG/h-100 g/h. At present, no electronic dosimeter allow such large measuring range without any hardware modifications (e.g. attenuation plates).

It should furthermore be noted that the invention is not restricted to terminal units for which the image sensor is a constituent element of an integrated digital camera. Instead, the invention also claims protection for corresponding terminal units, for which the image sensor is not a constituent element of a digital camera, but rather serves other purposes.

Also the term "ionizing radiation" used within the context of the invention is to be understood generally and comprises for example radioactive radiation, alpha radiation, beta radiation, gamma radiation, ultra-violet radiation, muon radiation, proton radiation, neutron radiation and X-ray radiation.

It should also be mentioned that the invention is not limited to the operating method described above for an electronic terminal unit, but also claims protection for a terminal unit on which the operating method according to the invention is carried out.

Finally, the invention also comprises the novel use of an electronic terminal unit (e.g. mobile phone) with an integrated digital camera with an image sensor for determining a dosage value of an ionizing radiation impinging on the image sensor.

BRIEF DESCRIPTION OF THE DRAWINGS

Other advantageous further developments of the invention are explained in greater detail below with reference to the figures together with the description of the preferred exemplary embodiments of the invention. The figures show as follows:

FIG. 1 shows a system according to the invention for determining the spatial distribution of radioactive radiation doses by means of several mobile phones 1.1-1.4, which respectively have an integrated digital camera 2.1-2.4, which are used within the context of the invention for radiation measurement.

Figure 1:
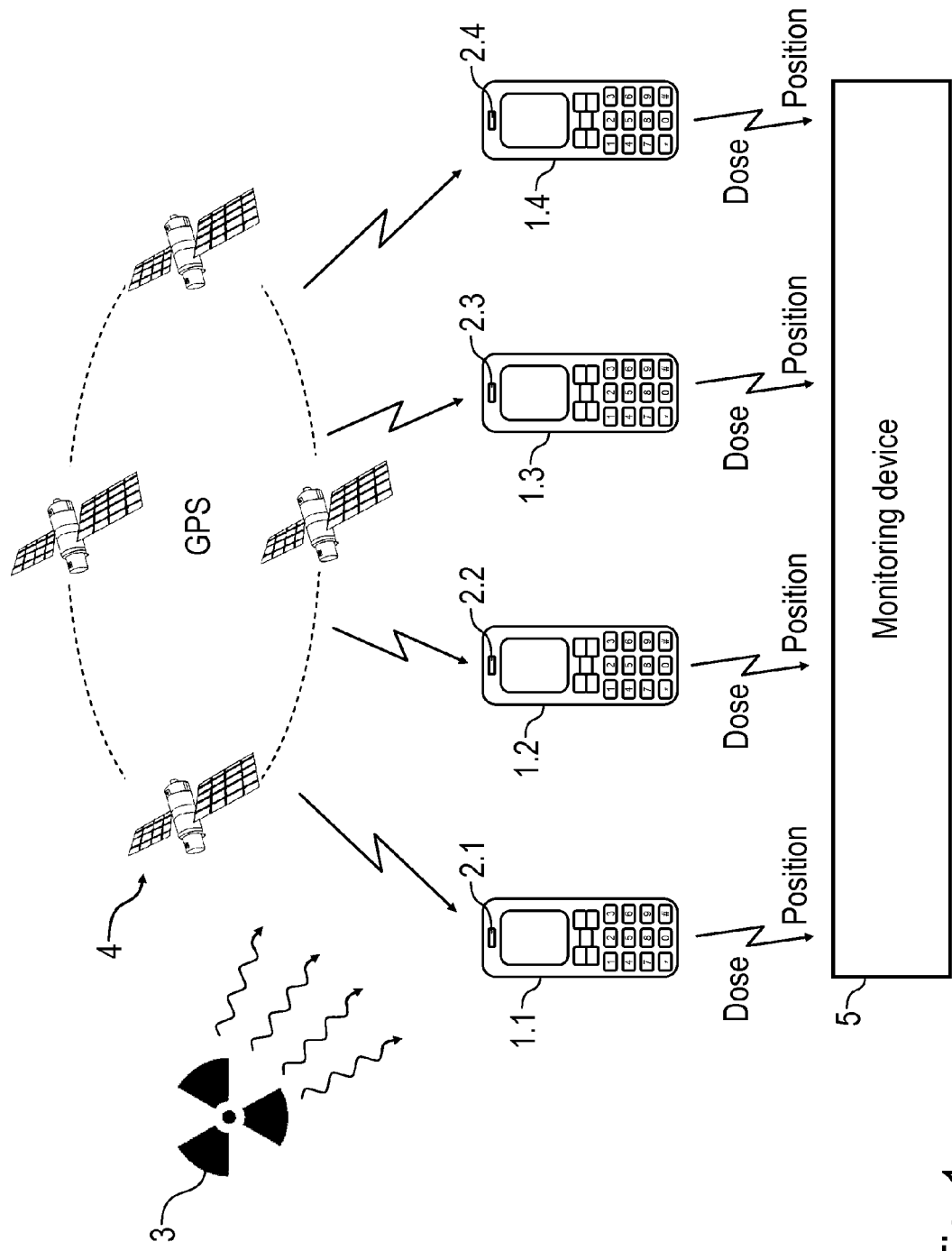
FIG. 1 a schematic representation of a system according to the invention for measurement of radiation doses by means of numerous mobile phones, which respectively have an integrated digital camera.

The drawing shows schematically a radioactive radiation source 3, which emits radioactive radiation, wherein the radioactive radiation impinges on the digital cameras 2.1-2.4 of the mobile phones 1.1-1.4 and is detected here, as will be described in detail later.

The individual mobile phones 1.1-1.4 each have a GPS sensor (not represented), which determines the actual position of the individual mobile phones 1.1-1.4 by means of a GPS satellite navigation system 4, which is per se known from the prior art and must therefore not be described in more detail.

The individual mobile phones 1.1-1.4 each determine the radiation dose of the incident radioactive radiation at the location of the respective mobile phone 1.1-1.4 and transmit the measured dosage value together with the satellite-based determined position of the respective mobile phone 1.1-1.4 to a central monitoring device 5. The central monitoring device 5 can then calculate a geographical distribution of the radiation dose from the measured dosage values and the associated position values.

Figure 2A:
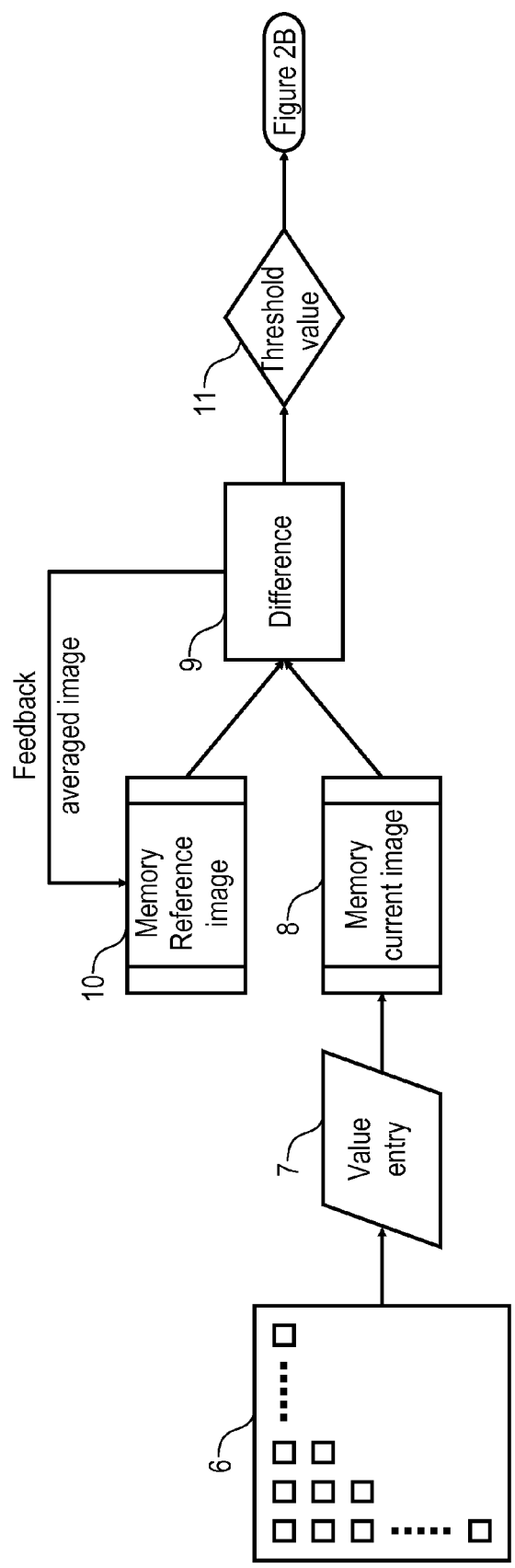
FIGS. 2A and 2B a flow chart for clarifying the operating method according to the invention, FIG. 3 measurement charts using the method according to the invention, FIG. 4 a schematic representation for clarifying the method according to the invention.
Figure 2B:
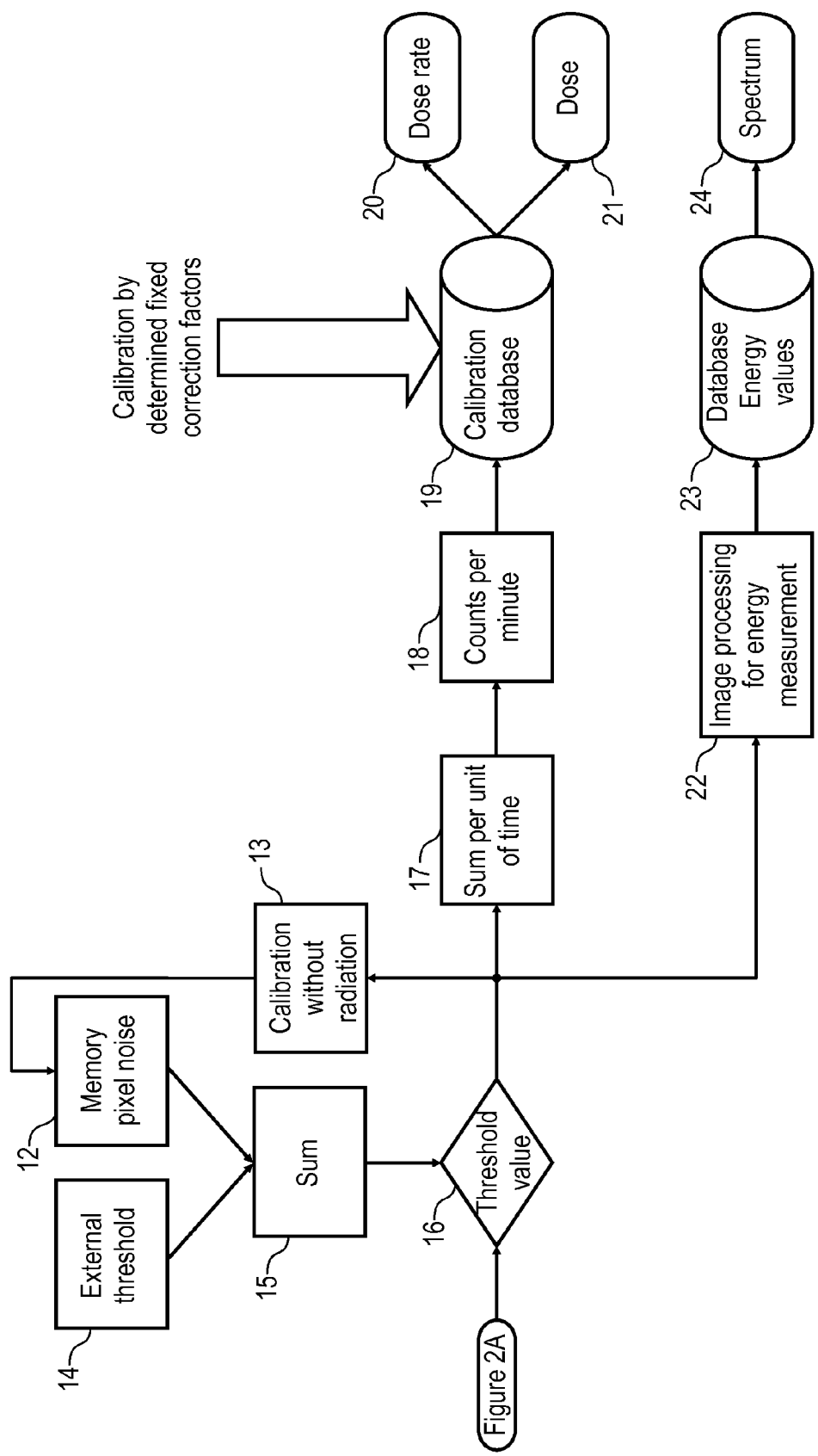

The FIGS. 2A and 2B show the operating method according to the invention for the mobile phones 1.1-1.4 in the form of a flow chart.

At first, the drawings show an image sensor 6 with numerous image elements arranged in the form of a matrix for radiation measurement. The image sensor 6 can, for example, be a CCD sensor or a CMOS sensor.

A step 7 comprises a value entry of the images measured by the image sensor 6 with a frame rate of 40-60 fps (frames per second). Optionally, single images are also possible, then if necessary with shutter times, which correspond to partial image capturing, or conversely time exposures with pretty large shutter times.

The measured images are then saved in a step 8 in an image memory.

Subsequently, in a step 9, a differentiation takes place between the actual image saved in step 8 and a reference image saved in a step 10, wherein a reference memory contains an average brightness per image element (pixel) from the previous captured images. The thus reached averaging can take place depending on the actual difference, for example according to the following formula:

$$Ref = Ref \cdot n + \text{new pixel} \cdot m/(n+m)$$

with
Ref: brightness of the reference image
n: weighting factor for taking into account the reference image with n+m=1
m: weighting factor for taking into account the new image with n+m=1
new pixel: brightness of the new image The difference thus determined is then compared in a step 11 with an upper limit value and a lower limit value, wherein a counting event is triggered when the measured difference value lies between the upper limit value and the lower limit value.

Optionally, there is the option of a memory 12 for pixel noise represented in FIG. 2B, which is filled for a calibration process 13 with the noise values per pixel. To do so, several measurements are carried out in the dark and without any radiation. The individual differences between the current image and the last image are added up with a matrix (noise values per pixel) and then e.g. maximum values resp., after statistical evaluation, the determined values are saved (Gaussian distribution taking into account the incident background radiation). Furthermore, an external threshold 14 can be added, which is added up to the pixel threshold from the memory 12 in a step 15, which provides for more stable results.

A threshold value comparison 16 then provides an analogue or digital signal when threshold values are exceeded resp.—in case of negative sign—fallen short of. In a step 17, the counting events are then added up over a certain unit of time.

Thereupon, in a step 18, the number of counting events (counts) is calculated per minute.

Via a calibration table 19, the assignment to a standardized dose rate (e.g. based on the counts per minute) resp. dose (from the total number of counts) is then created. The calibration table can be created for a group of sensors or created individually through a measurement process with calibrated radiation source. Optionally, a correction factor can be provided for simplified calibration with one or two points.

As a result, in a step 20, a dose rate and, in a step 21, a dose is then output.

Furthermore, there is also the option for an image processing 22 for determining the energy value of the incident photons. Thus, low-energy photons generally trigger only a counting event in a single image element of the image sensor 6. High-energy photons lead in contrast to a crosstalk between neighboring image elements of the image sensor 6, so that a group (cluster) of several neighboring image elements of the image sensor 6 trigger a counting event. Through the image processing 22, such groups of activated image elements can then be determined, whereby a spectral distribution can be calculated in an approximate manner. The values thus obtained are compared with a data base 23 of the energy values, whereupon a spectrum of the incident radiation is then output in a step 24.

Figure 3:
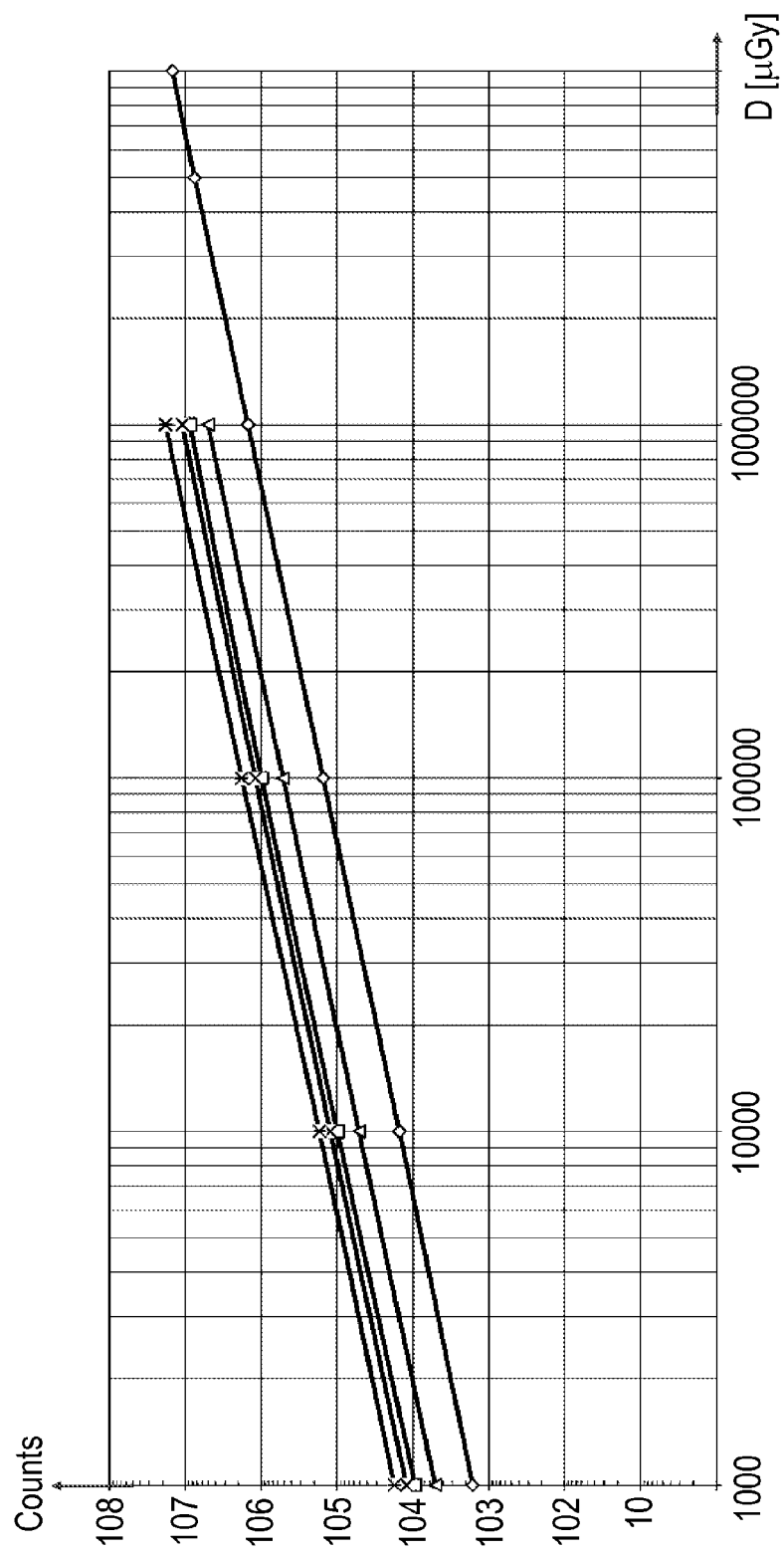

FIG. 3 shows for different mobile phone types the measured counting events (counts) as a function of the energy dose D of the incident radioactive radiation. It can be seen in the diagram that the characteristics in double logarithmic scale run extremely linearly, which indicates a corresponding suitability for metrological purposes.

Figure 4:
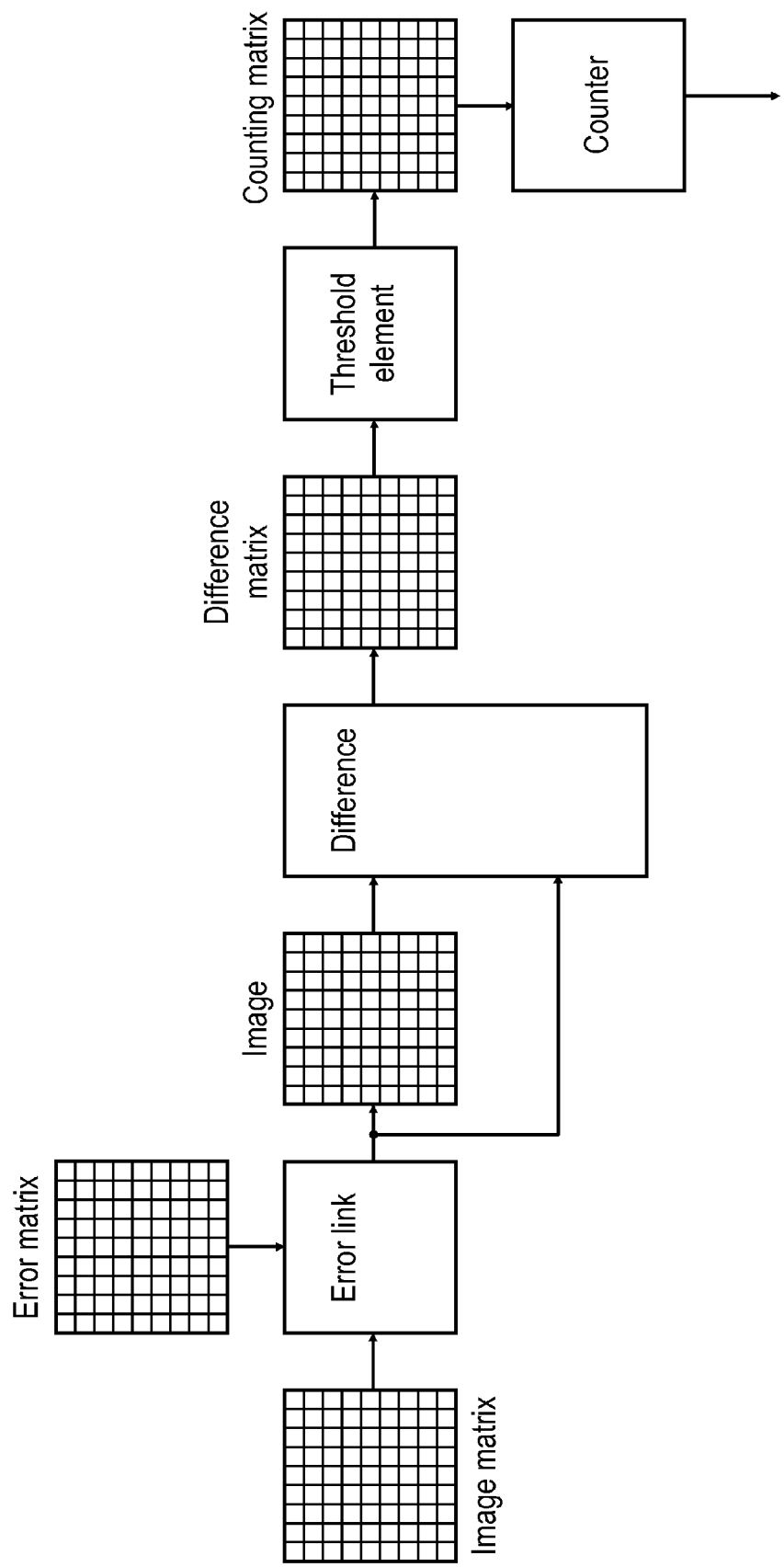

FIG. 4 shows the principle according to the invention once again schematically in a simplified form.

So, an image sensor measures at first an image matrix, which is then linked with an error matrix in order to hide image elements of the image matrix that failed due to faults for the subsequent signal evaluation. Furthermore, the error matrix allows adaptation of the respective characteristic of the individual image elements in order to, for example, compensate for defects due to aging. The image matrix thus obtained is then temporarily stored in a frame buffer.

Subsequently, there is a differentiation between the currently obtained image and the previous image temporarily stored in the image memory, wherein the result is saved in a difference matrix.

A threshold element then subsequently checks whether the individual values of the difference matrix lie between an upper limit value and a lower limit value. If this is the case, a counting event is then triggered in a counting matrix.

Finally, a counter then measures the number of counting events within the whole counting matrix, wherein the spatial resolution gets lost and taking into account all elements of the counting matrix leads to a highly accurate determination of the dose.

The invention is not limited to the preferred exemplary embodiments described above. Instead, a plurality of variants and modifications are possible, which also make use of the concept of the invention and thus fall within the scope of protection. Furthermore, the invention also claims protection for the subject-matter and the features of the subclaims independently of the claims to which they refer.

LIST OF REFERENCE NUMERALS 1.1-1.4 Mobile phones
2.1-2.4 Digital cameras

3 Radiation source
4 GPS satellite navigation system
5 Monitoring device
6 Image sensor
7 Step "Value entry"
8 Step "Save"
9 Step "Differencing"
10 Step "Reference image"
11 Step "Threshold value testing"
12 Memory for pixel noise
13 Calibration process
14 External threshold
15 Step "Summation"
16 Threshold value comparison
17 Step "Summing-up per unit of time"
18 Step "Counts per minute"
19 Calibration table
20 Output Dose rate
21 Output Dosage
22 Image processing
23 Database of the energy values
24 Output Spectrum

The invention claimed is:

1. An operating method for an electronic terminal unit with an image sensor with a plurality of image elements, said method comprising:
 a) determining a dosage value of ionizing radiation impinging on the image sensor;
 b) measuring an image matrix through the image sensor, wherein the image matrix for the individual image elements of the image sensor respectively contains an associated image element and the individual image elements of the image matrix are respectively assigned to an electric output signal associated with the image element of the image sensor;
 c) statistical evaluation of the image matrix and calculation of the dosage value in a framework of this statistical evaluation;
 d) calculating a counting matrix from the image matrix, wherein the counting matrix for the individual image elements of the image matrix respectively contains an associated counter; and
 e) incrementing individual counters of the counting matrix when an associated image element of the image matrix lies between a lower value and an upper limit value.

2. The operating method according to claim 1, further comprising the following step in the framework of statistical evaluation:
 adding the individual counters of the counting matrix to have a sum, which reproduces an energy dose of the ionizing radiation.

3. The operating method according to claim 1, further comprising the following steps:
 a) determining an error matrix with a plurality of correction elements, wherein individual correction elements of the error matrix are respectively assigned to an image element of the image matrix, and
 b) linking the image matrix with the error matrix for compensation of errors of the individual image elements of the image sensor.

4. The operating method according to claim 1, further comprising the following steps:
 a) intermediate storage of the image matrix measured by the image sensor,
 b) calculating a difference matrix as a difference of a currently measured image matrix with a previously measured and temporarily stored image matrix, and
 c) carrying out the statistical evaluation based on the difference matrix.

5. The operating method according to claim 1, further comprising the following step:
 determining a spectral distribution of the ionizing radiation through evaluation of the counting matrix.

6. The operating method according to claim 1, further comprising the following step:
 transmission of the measured dosage value and/or a control signal derived therefrom by use of a transmitter located in the terminal unit from the terminal unit to an external monitoring device.

7. The operating method according to claim 6, wherein the transmitter is selected from the group consisting of:
 a) a Bluetooth module
 b) a RFID transponder,
 c) a mobile phone, and
 d) a WLAN module.

8. The operating method according to claim 6, further comprising the following steps:
 a) detecting a geographical position of the terminal unit by use of a position sensor integrated in the terminal unit, and
 b) transmission of the geographical position from the terminal unit to the external monitoring device.

9. The operating method according to claim 1, further comprising the following step:
 calibration of the calculation of the dosage value in such a way that the terminal unit is exposed to a radiator as normal.

10. The operating method according to claim 1, wherein the terminal unit is a member selected from the group consisting of:
 a) a mobile phone,
 b) a digital camera, and
 c) a transportable computer.

11. The operating method according to claim 1, wherein the image sensor is a CCD sensor or a CMOS sensor.

12. The operating method according to claim 1, wherein the dosage value is one of the following values:
 a) an energy dose of the ionizing radiation
 b) an equivalent dose of the ionizing radiation, or
 c) a dose rate of the ionizing radiation.

13. The operating method according to claim 1, wherein the measured ionizing radiation includes at least one of the following types:
 a) radioactive radiation,
 b) alpha radiation,
 c) beta radiation,
 d) gamma radiation,
 e) pulsed radiation,
 f) ultra-violet radiation,
 g) X-ray radiation,
 h) muon radiation,
 i) neutron radiation, and
 j) proton radiation.

14. A terminal unit comprising:
 a) an image sensor with a plurality of image elements,
 b) a program memory for storing an application program and
 c) a processor for executing the application program,
 wherein the application program saved in the program memory is adapted to carry out the operating method according to claim 1.

15. A system for radiation measurement comprising:
a) several terminal units according to claim 14,
b) a monitoring device, and
c) a wireless connection between the terminal units and the monitoring device, wherein the terminal units transmit the measured dosage value and/or a geographical position of the respective terminal units via a wireless connection to the monitoring device.

16. The terminal unit according to claim 14, wherein the terminal unit is a mobile phone.

17. The operating method according to claim 1, wherein the electronic terminal unit is a mobile phone.

18. The operating method according to claim 1, further comprising the following step in the framework of statistical evaluation:
computing a dose rate as a quotient of an energy dose and a duration of measurement.

19. An operating method for an electronic terminal unit with an image sensor with a plurality of image elements, said method comprising:
a) determining a dosage value of ionizing radiation impinging on the image sensor;
b) determining a spectral distribution of the ionizing radiation through evaluation of a counting matrix;
c) determining groups of neighboring counting events in the counting matrix,
d) determining a spatial extension of the groups, and
e) determining an energy of the ionizing radiation from the spatial extension of the groups.

20. An operating method for an electronic terminal unit with an image sensor with a plurality of image elements, said method comprising determining a dosage value of ionizing radiation impinging on the image sensor, wherein
a) the individual image elements of the image sensor are each read-out periodically,
b) a dead time lies between directly sequential read operations, respectively, within which the respective image element is insensitive and detects no radiation, and
c) the image elements of the image sensor are read-out in a time-shifted manner, so that the dead times of the individual image elements are also time-shifted.

* * * * *